(12) United States Patent
Ahn et al.

(10) Patent No.: US 7,960,207 B2
(45) Date of Patent: Jun. 14, 2011

(54) ORGANIC THIN FILM TRANSISTOR AND METHOD OF FABRICATING THE SAME

(75) Inventors: Taek Ahn, Suwon-si (KR); Min-Chul Suh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 320 days.

(21) Appl. No.: 11/595,568

(22) Filed: Nov. 10, 2006

(65) Prior Publication Data

US 2007/0111371 A1 May 17, 2007

(30) Foreign Application Priority Data

Nov. 11, 2005 (KR) .................. 10-2005-0108043

(51) Int. Cl.
*H01L 51/40* (2006.01)
(52) U.S. Cl. .................. 438/99; 257/E51.006
(58) Field of Classification Search .......... 257/40, 257/E51.001–E51.052, 57, 66, E27.117–E27.119; 438/99
See application file for complete search history.

(56) References Cited

U.S. PATENT DOCUMENTS

| | | | |
|---|---|---|---|
| 5,989,945 A | 11/1999 | Yuda | |
| 2003/0075532 A1 | 4/2003 | Salmon et al. | |
| 2003/0160235 A1* | 8/2003 | Hirai | 257/40 |
| 2004/0266054 A1* | 12/2004 | Brazis et al. | 438/99 |
| 2005/0026344 A1* | 2/2005 | Weng et al. | 438/197 |
| 2005/0211975 A1* | 9/2005 | Kawasaki et al. | 257/40 |
| 2005/0258487 A1* | 11/2005 | Suh et al. | 257/347 |
| 2006/0097254 A1* | 5/2006 | Ahn et al. | 257/57 |
| 2007/0042525 A1* | 2/2007 | Dimmler | 438/99 |
| 2008/0194056 A1* | 8/2008 | Cain et al. | 438/99 |
| 2009/0189147 A1* | 7/2009 | Fix et al. | 257/40 |

FOREIGN PATENT DOCUMENTS

| | | |
|---|---|---|
| JP | 1-130494 | 5/1989 |
| JP | 5-95178 | 4/1993 |
| JP | 9-61296 | 3/1997 |
| JP | 2004-281477 | 10/2004 |
| JP | 2005-223286 | 8/2005 |
| KR | 10-2004-0015717 | 2/2004 |
| KR | 10-2004-0097231 | 11/2004 |
| KR | 10-2005-0111487 | 11/2005 |

(Continued)

OTHER PUBLICATIONS

Yagi, I., et al., "Direct Observation of Contact and Channel Resistance in Pentacene Four-Terminal Thin-Film Transistor Patterned by Laser Ablation Method." Appl. Phys. Lett., vol. 84, No. 5 (Feb. 2, 2004): pp. 813-815.*

(Continued)

*Primary Examiner* — Matthew W Such
(74) *Attorney, Agent, or Firm* — Christie, Parker & Hale, LLP

(57) ABSTRACT

An organic thin film transistor (OTFT) and a method of fabricating the same are provided in which an organic layer and metal interconnections are formed to have certain linewidths and shapes such that a degradation of device characteristics is prevented. The method includes providing a substrate, forming a gate electrode on the substrate, forming a gate insulating layer on the gate electrode, forming source and drain electrodes on the gate insulating layer, and forming a semiconductor layer on the source and drain electrodes. The gate electrode is formed by an inkjet printing method and ablated by a laser.

6 Claims, 3 Drawing Sheets

FOREIGN PATENT DOCUMENTS

| | | |
|---|---|---|
| KR | 10-2006-0108945 | 10/2006 |
| WO | WO 02/095805 A2 | 11/2002 |
| WO | WO 2005069399 A1 * | 7/2005 |
| WO | WO 2006106312 A1 * | 10/2006 |

OTHER PUBLICATIONS

Roichman, Y. & Tessler, N. "Structures of Polymer Field-Effect Transistor: Experimental and Numerical Analysis." Appl. Phys. Lett., vol. 80 (2002): pp. 151-153.*

Schrodner, M., et al. "Polymer Field Effect Transistors Made by Laser Patterning." Org. Elect., vol. 6 (2005): pp. 161-167.*

Parashkov, P., et al. "Organic Vertical-Channel Transistors Structured Using Excimer Laser." Appl. Phys. Lett., vol. 85 (2004): pp. 5751-5753.*

Patent Abstracts of Japan, Publication No. 01-130494, dated May 23, 1989 in the name of Toshinao Suzuki et al.

Patent Abstracts of Japan, Publication No. 05-195178, dated Apr. 16, 1993 in the name of Shoji Kiribayshi.

Patent Abstracts of Japan, Publication No. 09-061296, dated Mar. 7, 1997 in the name of Akihiro Yamanaka et al.

Patent Abstracts of Japan, Publication No. 2005-223286, dated Aug. 18, 2005 in the name of Takeo Kawase et al.

Korean Patent Abstracts, Publication No. 1020050111487 A dated Nov. 25, 2005 in the name of Min Chul Suh et al.

Korean Patent Abstracts, Publication No. 1020060108945 A dated Oct. 18, 2006 in the name of Taek Ahn et al.

English Abstract of WO/1997/043689 corresponding to KR 10-2004-0097231 listed above, which also relates to U.S. 5,989,945 listed above.

Yagi, Iwao et al., Applied Physics Letters, *Direct observation of contact and channel resistance in pentacene four-terminal thin-film transistor patterned by laser ablation method*, Feb. 2, 2004, 3 pgs (pp. 813-815), vol. 84, No. 5.

Office action dated Nov. 17, 2006 for corresponding Korean Patent Application No. 10-2005-0108043.

Patent Abstracts of Japan, Publication No. 2004-281477; Publication Date: Oct. 7, 2004; in the name of Hirai.

* cited by examiner

ORGANIC THIN FILM TRANSISTOR AND METHOD OF FABRICATING THE SAME

CROSS-REFERENCE TO RELATED APPLICATION

This application claims priority to and the benefit of Korean Patent Application No. 10-2005-0108043, filed on Nov. 11, 2005, in the Korean Intellectual Property Office, the entire content of which is incorporated herein by reference.

BACKGROUND OF THE INVENTION

1. Field of the Invention

The present invention relates to an organic thin film transistor (OTFT) and a method of fabricating the same, and more particularly, to an OTFT and a method of fabricating the same in which an organic layer and metal interconnections thereof are formed to have certain linewidths and shapes.

2. Description of the Related Art

In general, a thin film transistor (TFT) includes a semiconductor layer, a gate electrode, and source and drain electrodes. In more detail, the semiconductor layer includes heavily-doped source and drain regions and a channel region interposed between the source and drain regions. The gate electrode is electrically isolated from the semiconductor layer and disposed in a region corresponding to the channel region. Also, the source and drain electrodes are in contact with the source and drain regions, respectively. The TFT may function as a switching and/or a driving device for a flat panel display (FPD), such as a liquid crystal display (LCD) or an organic light emitting display (OLED), to control operations of one or more pixels of the FPD.

In at least some applications, it is required that FPDs be made to be thin and flexible. Thus, there have been many attempts at adopting a plastic substrate in place of a conventional glass substrate such that the FPDs are more flexible. In making use of the plastic substrate, a method of fabricating a TFT at a low temperature has been under study.

As a result, an organic TFT (OTFT) including an organic semiconductor layer has attracted much attention. The OTFT can embody a low-cost TFT because it may be fabricated at a low temperature. However, during fabrication of the OTFT, the organic semiconductor layer can be damaged by an organic solvent when the organic semiconductor layer is produced by using a photolithography process. Thus, device characteristics of the OTFT may be adversely affected.

Therefore, an inkjet printing method is often used in place of the photolithography process, to prevent device characteristics of the OTFT from being adversely affected and to simplify the fabrication process. In addition, the inkjet printing method neither requires use of an expensive deposition chamber nor consumes a large amount of materials.

However, the inkjet printing method requires surface processing to be performed in advance since, when ink is applied to a desired location, a linewidth and a shape of the applied ink are determined by surface properties of the desired location. The surface processing is often performed using a chemical etching technique and/or a plasma etching technique. Even when surface processing is performed, however, it is still difficult to use the inkjet printing method to produce an organic layer and metal interconnections having linewidths and shapes that are substantially uniform. As a result, interconnection resistances are increased, thereby adversely affecting device characteristics of the OTFT.

SUMMARY OF THE INVENTION

An aspect of the present invention provides an organic thin film transistor (OTFT) and a method of fabricating the same in which an organic layer and metal interconnections are formed to have certain linewidths and shapes such that an increase in interconnection resistances and a corresponding degradation of device characteristics are avoided.

In an exemplary embodiment of the present invention, a method of fabricating an OTFT includes providing a substrate, forming a gate electrode on the substrate, forming a gate insulating layer on the gate electrode, forming source and drain electrodes on the gate insulating layer, and forming a semiconductor layer on the source and drain electrodes. The gate electrode is formed by an inkjet printing method and ablated by a laser.

In another exemplary embodiment of the present invention, a method of fabricating an OTFT includes providing a substrate, forming a gate electrode on the substrate, forming a gate insulating layer on the gate electrode, forming source and drain electrodes on the gate insulating layer, and forming a semiconductor layer on the source and drain electrodes. The source and drain electrodes are formed by an inkjet printing method and ablated by a laser.

In still another exemplary embodiment of the present invention, a method of fabricating an OTFT includes providing a substrate, forming a gate electrode on the substrate, forming a gate insulating layer on the gate electrode, forming source and drain electrodes on the gate insulating layer, and forming a semiconductor layer on the source and drain electrodes. The semiconductor layer is formed by an inkjet printing method and ablated by a laser.

In yet another exemplary embodiment of the present invention, an OTFT includes a substrate, a gate electrode disposed on the substrate, a gate insulating layer disposed on the gate electrode and having a surface roughness Root Mean Square (RMS) in a range from about 7 to about 9 Å, source and drain electrodes disposed on the gate insulating layer, and a semiconductor layer disposed on the source and drain electrodes.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
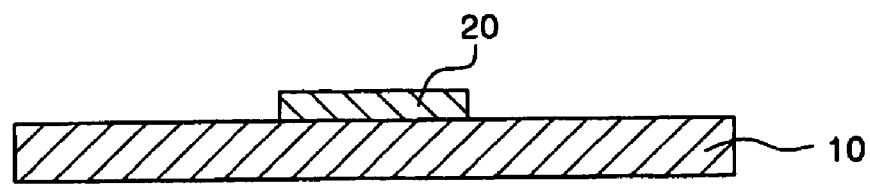
FIGS. 1 and 2 are cross-sectional views of an organic thin film transistor (OTFT) according to an exemplary embodiment of the present invention.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

In the drawings, thicknesses of layers and regions shown are enlarged for clarity. Same (or like) reference numerals are used to denote same (or like) elements throughout the specification.

Figure 2:
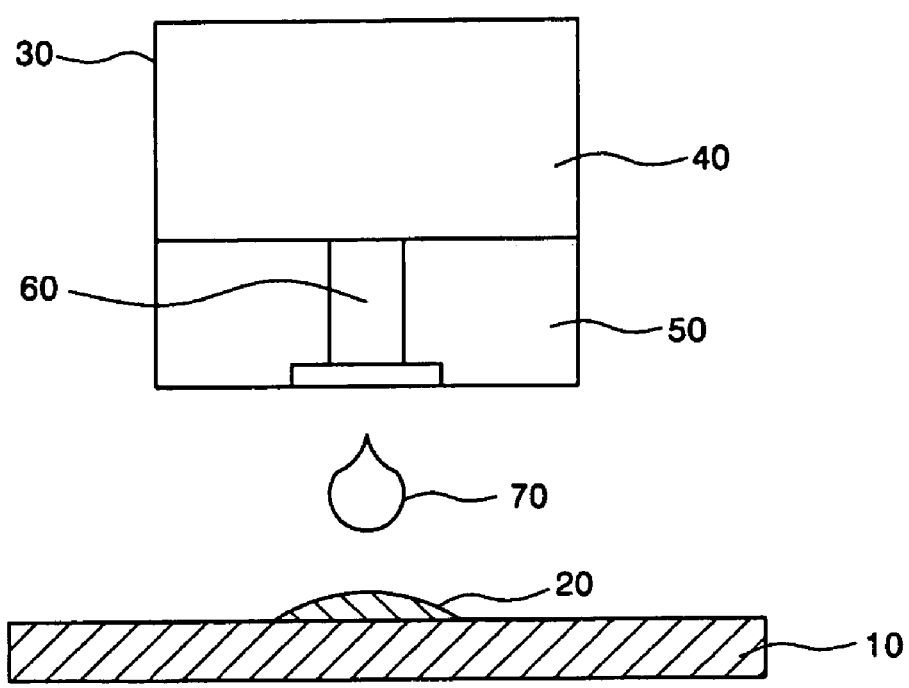

FIGS. 1 and 2 are cross-sectional views of an organic thin film transistor (OTFT) according to an exemplary embodiment of the present invention.

Referring to FIG. 1, the OTFT includes a substrate 10. The substrate 10 may include one or more flexible materials, such as a plastic and/or a conductive material. A gate electrode 20 is formed on the substrate 10 using an inkjet printing method. The gate electrode 20 may include a material selected from the group consisting of Al, Cr, Cu, and combinations thereof.

An inkjet printing method may be categorized as a thermal type or a piezoelectric type. In both types, ink is sprayed from a nozzle due to a pressure difference. In one embodiment, the piezoelectric-type inkjet printing method is used. Referring to FIG. 2, a piezoelectric-type inkjet apparatus 30 includes a container 40 for containing a material to be sprayed and an inkjet head 50 for spraying the material from the container 40.

The container 40 is filled with a gate electrode material 70, and the inkjet head 50 includes a piezoelectric device and a nozzle 60 for spraying the gate electrode material 70 from the container 40. When a voltage is applied to the piezoelectric device, physical pressure is generated, thus causing a repetitive contraction and relaxation of a flow path from the container 40 to the nozzle 60 (i.e., causing a capillary phenomenon to occur). Due to the capillary phenomenon, the gate electrode material 70 is sprayed through the nozzle 60. As a result, the gate electrode 20 is formed to have a specific width and height on the substrate 10.

Here, the gate electrode material 70 collides with the substrate 10 and spreads in directions according to surface properties of the substrate 10.

Figure 3:
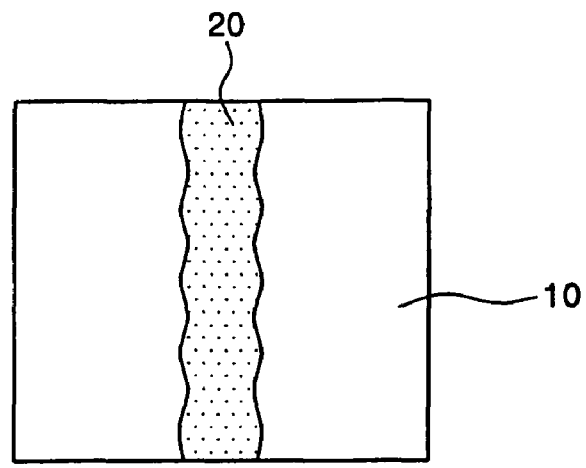
FIGS. 3 and 4 are plan views of the OTFT according to an exemplary embodiment of the present invention.
Figure 4:
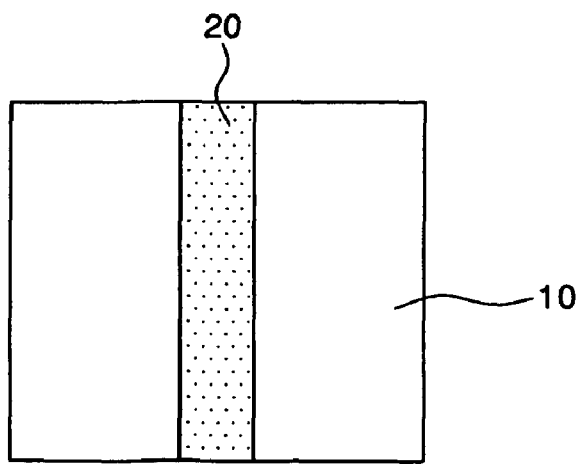

FIGS. 3 and 4 are plan views of the OTFT according to an exemplary embodiment of the present invention.

As shown in FIG. 3, the resultant gate electrode 20 may have substantially uneven edge portions. Thus, as an interconnection, the gate electrode may have a large interconnection resistance upon application of a voltage.

The edge portions of the gate electrode 20 may be trimmed by use of a laser ablation technique (LAT). In more detail, the edge portions of the gate electrode 20 may be irradiated with laser beams and removed. In one embodiment, the laser irradiation is performed using a 248-nm KrF excimer laser.

As shown in FIG. 4, the resulting gate electrode 20 has a more uniform linewidth and shape relative to that shown in FIG. 3.

A minimum width of the gate electrode 20 that can be obtained by the inkjet printing method is about 50 μm, and the aforementioned LAT can be used to reduce the minimum width of the gate electrode 20 to be about 5 μm. Also, as previously described, the LAT facilitates formation of the gate electrode 20 with a more uniform linewidth and shape, thereby minimizing (or reducing) the interconnection resistance of the gate electrode 20.

Figure 5:
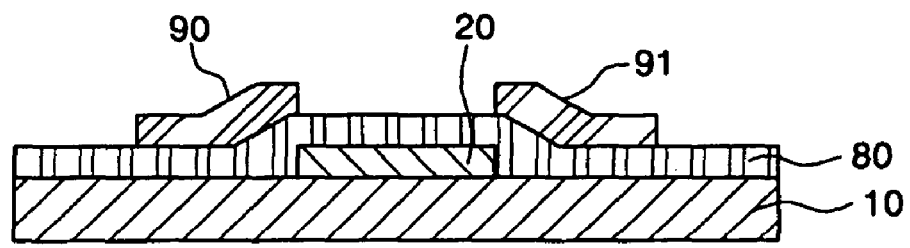
FIGS. 5 and 6 are cross-sectional views of the OTFT according to an exemplary embodiment of the present invention.
Figure 6:
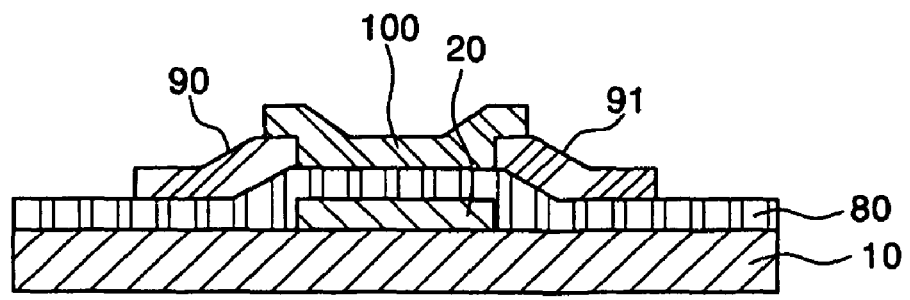

FIGS. 5 and 6 are cross-sectional views of the OTFT according to an exemplary embodiment of the present invention.

Referring to FIG. 5, a gate insulating layer 80 is formed on an entire (or substantially entire) surface of the substrate 10 on which the gate electrode 20 is located. The gate insulating layer 80 may include an organic material selected from the group consisting of polyimide, polymethyl methacrylate, polyvinylphenol, and combinations thereof and/or an inorganic material, such as silicon oxide and/or silicon nitride.

Source and drain electrodes 90 and 91 are formed on the gate insulating layer 80. The source and drain electrodes 90 and 91 may include a material selected from the group consisting of Al, Cr, Cu, and combinations thereof. Similar to the gate electrode 20, the source and drain electrodes 90 and 91 may be formed by spraying source and drain electrode materials, respectively, onto the substrate 10 by using an inkjet printing method and trimming respective edge portions of the source and drain electrodes 90 and 91 using an LAT.

That is, a flattened gate insulating layer 80 with a surface roughness Root Mean Square (RMS) in a range from 7 to 9 Å can be formed with the source and drain electrodes 90 and 91 using an inkjet printing method and an LAT instead of patterning the source and drain electrodes 90 and 91 by using a photolithography process. The resulting source and drain electrodes 90 and 91 are flattened such that their respective interconnection resistances are decreased. Furthermore, a breakdown of the gate insulating layer 80, which can be caused by a concentration of an electric field in uneven and protruding regions of the gate insulating layer 80, can be inhibited, thereby preventing (or reducing) deterioration of device characteristics of the OTFT.

Moreover, the use of the LAT reduces respective minimum widths (usually about 50 μm) of the source and drain electrodes 90 and 91, which can be obtained by the inkjet printing method, to about 5 μm and also forms the source and drain electrodes 90 and 91 to have respective linewidths and shapes that are more uniform to minimize (or reduce) their respective interconnection resistances. Therefore, in one embodiment, respective linewidths of the source and drain electrodes 90 and 91 are in a range from 5 to 50 μm.

Referring to FIG. 6, a semiconductor layer 100 is formed on the source and drain electrodes 90 and 91, to complete the OTFT according to the embodiment of the present invention.

The semiconductor layer 100 includes an organic semiconductor material. By way of example, the organic semiconductor material may include a polymer and/or a small molecule material. The polymer may include polythiophene (PT), poly (p-phenylenevinylene) (PPV), poly(p-phenylene) (PPP), polyfluorene (PF), polythiophene vinylene-(PTV), polythiophene-heterocyclic aromatic copolymer, or derivatives thereof. The small molecule material may include pentacene, tetracene, oligoacene of naphthalene, α-6-thiophene, oligothiophene of α-5-thiophene, metal-containing or metal-free phthalocyanine, pyromelitic dianhydride, pyromelitic diimide, perylene-tetra-carboxylic-dianhydride (PTCDA), perylene tetra-carboxylic di-imide (PTCDI), or derivatives thereof Similar to the gate electrode 20 and the source and drain electrodes 90 and 91, the semiconductor layer 100 may be formed by an inkjet printing method, and edge portions of the semiconductor layer 100 may be trimmed by using the LAT. Therefore, in one embodiment, a linewidth of the semiconductor layer 100 is in a range from 5 to 50 μm.

By forming the semiconductor layer 100 as described above, damage to the semiconductor layer 100 may be avoided, and the semiconductor layer 100 is formed to have a substantially uniform linewidth and shape.

In the present embodiment, the gate electrode 20, the source and drain electrodes 90 and 91, and the semiconductor layer 100 are all formed using an inkjet printing method and ablated with a laser. However, in other embodiments, at least one of the gate electrode 20, the source and drain electrodes 90 and 91, or the semiconductor layer 100 may be formed using an inkjet printing method and ablated with a laser.

An experimental example will now be described.

Experimental Example

A gate electrode was formed on a substrate, and polyvinylphenol was coated on the gate electrode by use of a spin coating method such that a gate insulating layer was formed to have a thickness of 5000 Å. Thereafter, Ag ink was sprayed onto the gate insulating layer using an inkjet method, thereby forming source and drain electrodes with respective thicknesses of 1000 Å.

Subsequently, edge portions of the source and drain electrodes were ablated with a 248-nm KrF excimer laser. After that, a surface roughness RMS of the gate insulating layer disposed under the ablated source and drain electrodes was measured by using an atomic force microscope (AFM).

Comparative Example

Similar to the Experimental example, a gate electrode, a gate insulating layer, and source and drain electrodes were formed on a substrate. Thereafter, the source and drain electrodes were patterned using a photolithography process, and a surface roughness RMS of the gate insulating layer disposed under the patterned source and drain electrodes was then measured using an AFM.

Table 1 shows the measurements of surface roughness RMS of regions A, B and C of the respective gate insulating layers according to the Experimental example and the Comparative example.

TABLE 1

|  | Region | RMS (Å) |
| --- | --- | --- |
| Experimental Example | A | 8.07 |
|  | B | 8.09 |
|  | C | 7.75 |
| Comparative Example | A | 68.64 |
|  | B | 56.05 |
|  | C | 71.68 |

Referring to Table 1, it can be seen that the surface roughness RMS of the regions of the gate insulating layer corresponding to the source and drain electrodes which were trimmed using an LAT according to the Experimental example is smaller in magnitude than that of the regions of the gate insulating layer corresponding to the source and drain electrodes which were patterned using a photolithography process according to the Comparative example.

That is, when forming the flattened gate insulating layer having a surface roughness RMS in a range from 7 to 9 Å, the source and drain electrodes can be subsequently flattened. As a result, interconnection resistances can be decreased, and a breakdown of the gate insulating layer, which can be caused by a concentration of an electric field in an uneven and protruding region of the gate insulating layer, can be inhibited, thereby preventing (or reducing) deterioration of device characteristics of the OTFT.

According to the exemplary embodiments of the present invention as described above, an organic semiconductor layer and metal interconnections are formed by an inkjet printing method and trimmed by an LAT, such that damage to the organic semiconductor layer can be avoided (or reduced) and the metal interconnections are formed to have certain linewidths and shapes. As a consequence, interconnection resistances can be decreased, thus preventing (or reducing) deterioration of device characteristics of an OTFT.

Therefore, a method of fabricating an OTFT according to embodiments of the present invention forms an organic layer and metal interconnections to have certain linewidths and shapes, such that interconnection resistances can be decreased and degradation of device characteristics can be prevented (or reduced).

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A method of fabricating an organic thin film transistor (OTFT), the method comprising:
   providing a substrate;
   forming a gate electrode on the substrate;
   forming a gate insulating layer on the gate electrode;
   forming separate source and drain electrodes by inkjet printing source and drain electrode materials separately on the gate insulating layer;
   trimming respective edges of the separate source and drain electrodes by laser ablation;
   patterning a semiconductor layer by inkjet printing a semiconductor material on the source and drain electrodes; and
   removing uneven edge portions of the patterned semiconductor layer by laser ablation,
   wherein the gate electrode is formed by inkjet printing a gate material and the gate electrode is trimmed by laser ablation after inkjet printing the gate material, and
   wherein the inkjet printing performed to form the gate electrode enables the gate electrode to have a patterned shape.

2. The method according to claim 1, wherein the semiconductor layer includes an organic material.

3. The method according to claim 1, wherein the semiconductor layer includes a material selected from the group consisting of polythiophene (PT), poly(p-phenylenevinylene) (PPV), poly(p-phenylene) (PPP), polyfluorene (PF), polythiophene vinylene (PTV), polythiophene-heterocyclic aromatic copolymer, pentacene, tetracene, oligoacene of naphthalene, α-6-thiophene, oligothiophene of α-5-thiophene, metal-containing phthalocyanine, metal-free phthalocyanine, pyromelitic dianhydride, pyromelitic diimide, perylene-tetra-carboxylic-dianhydride (PTCDA), perylene tetra-carboxylic di-imide (PTCDI), and derivatives thereof.

4. The method according to claim 1, wherein the substrate includes a plastic and/or a conductive material.

5. The method according to claim 1, wherein the gate electrode and the separate source and drain electrodes include a material selected from the group consisting of Al, Cr, Cu, and combinations thereof.

6. The method according to claim 1, wherein a linewidth of the gate electrode is in a range from about 5 to about 50 μm.

* * * * *